(12) United States Patent
Tang et al.

(10) Patent No.: US 11,134,560 B2
(45) Date of Patent: Sep. 28, 2021

(54) HEAT EXCHANGE PLATE WITH SLOTTED AIRFOIL FINS

(71) Applicant: Xi'an Jiaotong University, Xi'an (CN)

(72) Inventors: Guihua Tang, Xi'an (CN); Xiaolong Li, Xi'an (CN); Siqi Wang, Xi'an (CN); Yuanhong Fan, Xi'an (CN); Danlei Yang, Xi'an (CN)

(73) Assignee: Xi'an Jiaotong University, Xi'an (CN)

(*) Notice: Subject to any disclaimer, the term of this patent is extended or adjusted under 35 U.S.C. 154(b) by 0 days.

(21) Appl. No.: 16/814,776

(22) Filed: Mar. 10, 2020

(65) Prior Publication Data

US 2020/0296820 A1  Sep. 17, 2020

(30) Foreign Application Priority Data

Mar. 12, 2019  (CN) .......................... 201910186489.9

(51) Int. Cl.
*H05K 1/02* (2006.01)
*F28F 3/02* (2006.01)
*H01L 23/367* (2006.01)
*H01L 23/34* (2006.01)

(52) U.S. Cl.
CPC ............ *H05K 1/0209* (2013.01); *F28F 3/02* (2013.01); *F28F 2215/08* (2013.01); *F28F 2250/02* (2013.01); *H01L 23/345* (2013.01); *H01L 23/367* (2013.01); *H05K 2201/09063* (2013.01)

(58) Field of Classification Search
CPC ...... F28F 2250/02; F28F 2215/08; F28F 3/02; F28F 3/04; H05K 1/0209; H05K 2201/09063; H01L 23/345; H01L 23/367

USPC ........................................................ 165/80.3
See application file for complete search history.

(56) References Cited

U.S. PATENT DOCUMENTS 10,429,138 B2 * 10/2019 Gissen ................... F28F 13/08
2009/0294113 A1    12/2009 Cha et al.

FOREIGN PATENT DOCUMENTS

| CN | 102836675 A | 12/2012 |
|---|---|---|
| CN | 105465875 A | 4/2016 |
| CN | 107388854 A | 11/2017 |
| CN | 206695667 U | 12/2017 |
| CN | 107687780 A | 2/2018 |
| CN | 108180773 A | 6/2018 |

(Continued)

OTHER PUBLICATIONS

Li et al., "Numerical Analysis of Slotted Airfoil Fins for Printed Circuit Heat Exchanger in S-CO2 Brayton Cycle", J Nucl Eng Radiat Sci. 2019; DOI: 10.1115/1.4043098 (12 pages).

*Primary Examiner* — Joel M Attey
(74) *Attorney, Agent, or Firm* — Seed IP Law Group LLP

(57) ABSTRACT

The present disclosure presents a heat exchange plate with slotted airfoil fins for a printed circuit heat exchanger. In the present disclosure, a herringbone streamlined slot is arranged on a fin so that a part of the heat exchange fluid can flow through a channel of the slot and flow out from the tail of the fin. In such a way, the perpendicular hitting on the fin can be prevented, thereby prevent forming of the stagnation area, mitigating phenomenon of substantial flow resistance in this area and, in turn, reducing the pressure drop of channel. Meanwhile, the slotted area could substantially increase the heat exchanging area and thus improve the heat exchanging performance.

16 Claims, 2 Drawing Sheets

(56) References Cited

FOREIGN PATENT DOCUMENTS

| CN | 108801008 A | 11/2018 |
|---|---|---|
| JP | 2015-94499 A | 5/2015 |

* cited by examiner

HEAT EXCHANGE PLATE WITH SLOTTED AIRFOIL FINS

BACKGROUND

Technical Field

The present disclosure relates to a heat exchanger and more particularly a heat exchange plate with slotted airfoil fins for a printed circuit heat exchanger.

Description of the Related Art

The printed circuit heat exchanger (PCHE) is an efficient and compact heat exchanger which can be utilized under high temperature and high pressure. The heat exchanging core is manufactured by forming fluid passages on metal base plates using photochemically etching, machining, or the like, and then jointing the base plates together by means of a diffusion bonding method.

For the existing PCHE, the fluid passage is usually a continuous straight channel, a zigzag channel, etc. The zigzag channel can significantly enhance the heat transfer but, in the meantime, it also causes flow resistance. By contrast, an airfoil fin (AFF) can suppress the generation of separated flows so that the flow resistance can be significantly reduced while keeping the desired heat transfer performance. Therefore, the AFF channel has been widely used in existing PCHE.

However, there are some issues for the conventional AFF. The coming flow would normally hit on the front end of the fin, which in turn causes a flow stagnation area. In this area, the velocity and pressure gradients are fairly steep, resulting in a substantial flow resistance in this area. In some existing solutions, a sharp angle was made on the front end of the fin to alleviate the impact of this flow stagnation region. However, such an angle might result in a smaller disturbance at the front end, which in turn reduces the heat transfer performance of the existing fins.

BRIEF SUMMARY

An object of the present disclosure is to overcome a drawback or disadvantage of the existing solutions and provide a heat exchange plate with slotted airfoil fins, which could prevent forming of the stagnation area, mitigate phenomenon of substantial flow resistance in this area, and substantially increase the heat exchanging area and thus improve the heat transfer performance.

To this end, in the present disclosure, a heat exchange plate includes: a base plate including a number of fins, wherein each of the fins has a herringbone streamlined slot with a symmetrical airfoil structure.

In an embodiment of the present disclosure, a width of a herringbone part of the herringbone streamlined slot may be 15~30% of its length.

In an embodiment of the present disclosure, a head of the herringbone streamlined slot may be created from the front end of the fin in a coming flow direction.

In an embodiment of the present disclosure, the herringbone streamlined slot has a straight channel as a leading part and two branch channels branched at its middle part, forming a channel of a generally symmetrical herringbone arrangement.

In an embodiment of the present disclosure, the branch channels are curved channels whose centerlines are tangent to a central line of the straight channel at their joint point.

In an embodiment of the present disclosure, the ratio of a channel width of the herringbone streamlined slot to a thickness of the fin is 0.2~0.4.

In an embodiment of the present disclosure, the ratio of a length of the straight channel of the herringbone streamlined slot to the length of the fin is 0.3~0.6.

In an embodiment of the present disclosure, the ratio of the total length of the herringbone streamlined slot to the length of the fin is 0.6~0.9.

In an embodiment of the present disclosure, the herringbone streamlined slot is cut in the fin by means of photo-chemically etching or machining method.

In the present disclosure, a herringbone streamlined slot is arranged on the fin so that a part of the heat exchange fluid can flow through a channel of the slot and flow out from the tail of the fin. In this way, the perpendicular hitting on the fin can be prevented, which can prevent forming of the stagnation area, mitigate the phenomenon of substantial flow resistance in this area and, in turn, reduce a loss of the channel pressure drop. Meanwhile, the slotted area could substantially increase the heat exchanging area and thus improve the heat transfer performance.

DETAILED DESCRIPTION

To make the object, solutions and advantages of the present disclosure much clearer, exemplary embodiments of the present disclosure are described hereinafter in detail with reference to the accompanying drawings.

Figure 1:
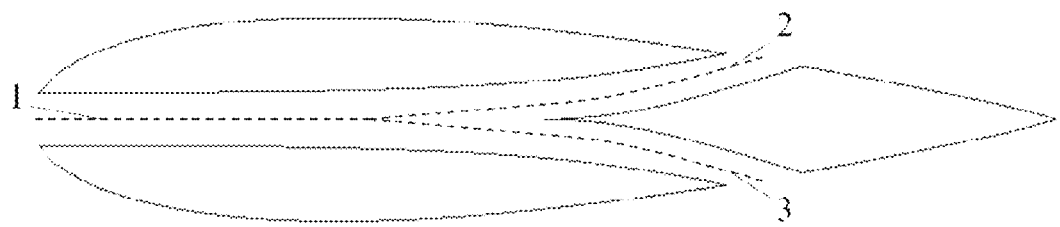
FIG. 1 illustrates a diagram of the slotted fin of the present disclosure.

As illustrated in FIG. 1, the present disclosure provides a heat exchange plate with slotted streamlined fins including a base plate containing several fins, each of the fins has a herringbone streamed slot fin (HSF) with a symmetrical airfoil structure, and the width of a herringbone part of the herringbone streamlined slot is 15~30% of its length.

In the present disclosure, based on the existing airfoil fin (AFF), a herringbone streamlined slot is arranged on the fin. The herringbone slot includes one straight channel 1 and two branch channels 2 and 3. The straight channel 1 is arranged at the head of AFF in the coming flow direction and the channel is branched into two branch channels 2, 3 at the middle part of the fin, forming a channel of a generally symmetrical herringbone arrangement. The branch channels 2 and 3 are curved channels and their centerlines are tangent to that of the straight channel 1 at their joint point, so that the branch channels 2 and 3 and straight channel 1 are connected into a smooth curve.

In embodiments of the present disclosure, the ratio of the channel width of the herringbone slot to the thickness of the fin is in a range between 0.2 and 0.4. The ratio of the length of the straight channel of the herringbone slot to the length of the fin is in a range between 0.3 and 0.6. The ratio of the total length of the herringbone slot to the length of the fin is in a range between 0.6 and 0.9.

It is suggested to use, during manufacturing, the photochemically etching method to cut the herringbone slotted fins on a side of the metal plate. Then the metal plates with fins are stacked together and jointed together by diffusion bonding method so that, the core of the herringbone streamed slot fin is obtained. Finally, some seal heads are installed on both ends of the core of the exchanger so as to form the whole PCHE.

Figure 2:
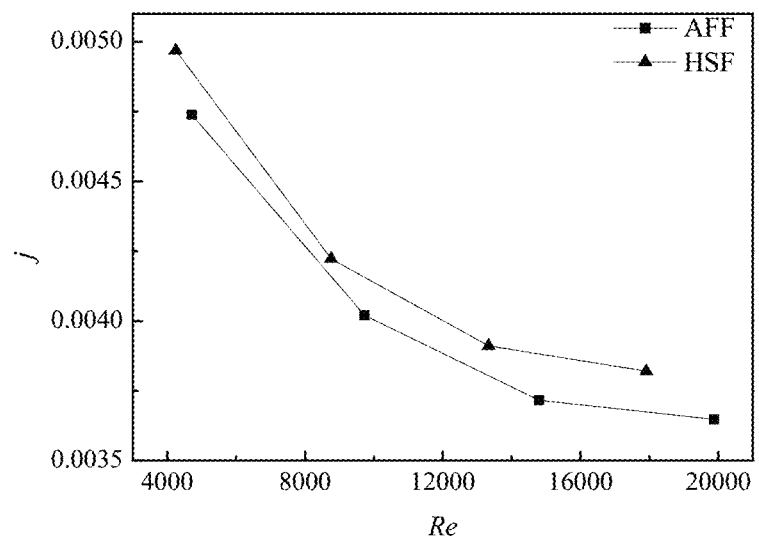
FIG. 2 illustrates a comparison of the thermal performance between the slotted fin of the present disclosure and a conventional airfoil fin.
Figure 3:
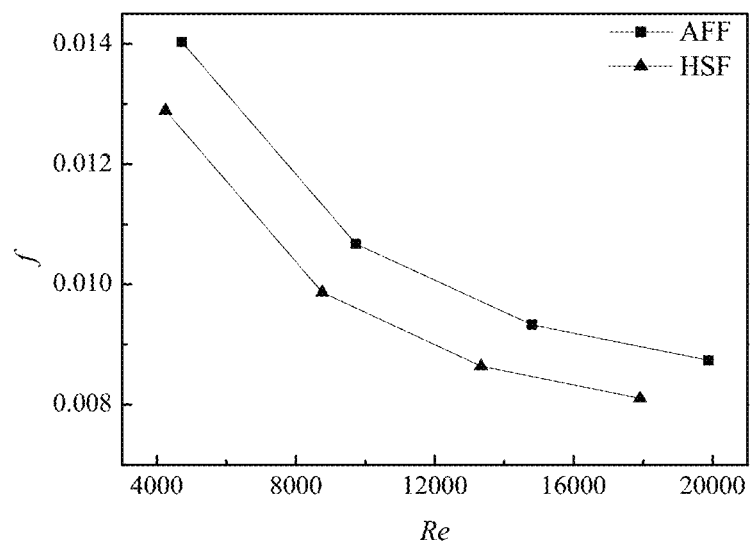
FIG. 3 illustrates a comparison of the hydraulic performance between the slotted fin and a conventional airfoil fin.

With the same fin dimension and arrangement, the PCHEs with HSFs and AFFs were simulated using a numerical simulation method. The simulated results are shown in FIG. 2 and FIG. 3. FIG. 2 illustrates a comparison of the heat exchange performances of two types of fins; and FIG. 3 illustrates a comparison of the resistance performance between two types of fins. It can be seen that the heat transfer performance of the HSF is better than that of AFF and the resistance factor is significantly reduced in the HSF compared to the AFF.

Figure 4:
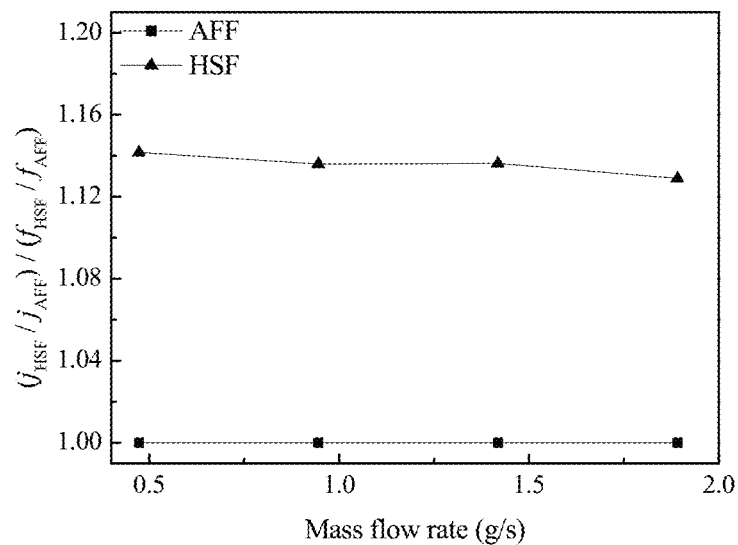
FIG. 4 illustrates the comparison of the overall performance between the slotted fin and a conventional airfoil fin.

The overall heat exchange performance comparison between the two types of fins is shown in FIG. 4. The AFF is taken as a reference and the overall performance JF coefficient $\eta=(j_{HSF}/j_{AFF})/(f_{HSF}/f_{AFF})$ under the same flow rate was introduced to evaluate the comprehensive performance of the fins. It can be seen that the overall heat exchange performance of the HSF is remarkably higher than that of the AFF.

Figure 5:
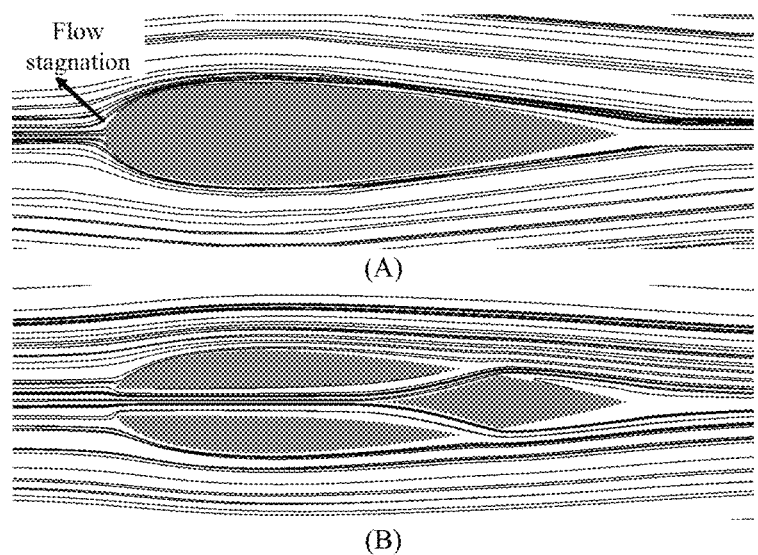
FIG. 5 illustrates the comparison of the streamlines around the slotted fin and a conventional airfoil fin.

FIG. 5 shows the streamlines around the two types of fins. It can be seen that in the AFF channel (FIG. 5A), at the leading edge of the fin, the coming flow normally or perpendicularly hits the fin, which causes a flow stagnation in this area. This flow stagnation causes a serious velocity gradient and an increase of local flow resistance in this region. While in the present HSF channel (FIG. 5B), a slot is created from the leading edge of the fin and a part of fluid flows into the slot channel of the HSF. Thus, the normal or perpendicular hitting is prevented, the flow stagnation in this region is mitigated and the flow resistance in this region can be reduced significantly. Meanwhile, when the fluid flows into the slot channel, the heat can be exchanged with the side surfaces of the slot channels. This can achieve an increase in the heat transfer area so that the thermal performance of HSF is higher than that of conventional AFF.

It shall be noted that the description made above is a heat exchange plate with herringbone slotted fins, which is applied in the printed circuit heat exchanger (PCHE). The above description is only a preferred example of the present disclosure, and the present disclosure is not limited to this. Various modifications, equivalent replacement and improvement made within the spirit and principle of the disclosure shall fall within the protection scope of the disclosure.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A heat exchange plate with slotted airfoil fins, comprising:
    a base plate including a number of fins, wherein each of the fins has a herringbone streamlined slot with a symmetrical airfoil structure, and
    wherein the herringbone streamlined slot has a leading part as a straight channel and is divided into two branch channels at its middle part, forming a channel of a generally symmetrical herringbone arrangement.

2. The heat exchange plate with slotted airfoil fins of claim 1, wherein a width of a herringbone formed by the herringbone streamlined slot is 15~30% of a length of the herringbone.

3. The heat exchange plate with slotted airfoil fins of claim 1, wherein a head of the herringbone streamlined slot is created from a front end of the fin in a coming flow direction.

4. The heat exchange plate with slotted airfoil fins of claim 1, wherein the branch channels are curved channels whose centerlines are tangent to a central line of the straight channel at their joint point.

5. The heat exchange plate with slotted airfoil fins of claim 1, wherein a ratio of a channel width of the herringbone streamlined slot to a thickness of the fin is 0.2~0.4.

6. The heat exchange plate with slotted airfoil fins of claim 1, wherein a ratio of a length of the straight channel of the herringbone streamlined slot to a length of the fin is 0.3~0.6.

7. The heat exchange plate with slotted airfoil fins of claim 1, wherein a ratio of a total length of a herringbone formed by the herringbone streamlined slot to a length of the fin is 0.6~0.9.

8. The heat exchange plate with slotted airfoil fins of claim 1, wherein the herringbone streamlined slot is cut in the fins by means of a photochemically etching or machining method.

9. A heat exchange plate with slotted airfoil fins, comprising:
    a base plate including a number of fins, wherein each of the fins has a herringbone streamlined slot with a symmetrical airfoil structure, and
    wherein a head of the herringbone streamlined slot is created from a front end of the fin in a coming flow direction.

10. The heat exchange plate with slotted airfoil fins of claim 9, wherein a width of a herringbone formed by the herringbone streamlined slot is 15~30% of a length of a herringbone.

11. The heat exchange plate with slotted airfoil fins of claim 9, wherein the herringbone streamlined slot has a leading part as a straight channel and is divided into two branch channels at its middle part, forming a channel of a generally symmetrical herringbone arrangement.

12. The heat exchange plate with slotted airfoil fins of claim 11, wherein the branch channels are curved channels whose centerlines are tangent to a central line of the straight channel at their joint point.

13. The heat exchange plate with slotted airfoil fins of claim 11, wherein a ratio of a channel width of the herringbone streamlined slot to a thickness of the fin is 0.2~0.4.

14. The heat exchange plate with slotted airfoil fins of claim 11, wherein a ratio of a length of the straight channel of the herringbone streamlined slot to a length of the fin is 0.3~0.6.

15. The heat exchange plate with slotted airfoil fins of claim 11, wherein a ratio of a total length of a herringbone formed by the herringbone streamlined slot to a length of the fin is 0.6~0.9.

16. The heat exchange plate with slotted airfoil fins of claim 9, wherein the herringbone streamlined slot is cut in the fins by means of a photochemically etching or machining method.

* * * * *